US011605717B2

(12) United States Patent
Xie et al.

(10) Patent No.: US 11,605,717 B2
(45) Date of Patent: Mar. 14, 2023

(54) WRAPPED-AROUND CONTACT FOR VERTICAL FIELD EFFECT TRANSISTOR TOP SOURCE-DRAIN

(71) Applicant: International Business Machines Corporation, Armonk, NY (US)

(72) Inventors: Ruilong Xie, Niskayuna, NY (US); Eric Miller, Watervliet, NY (US); Jeffrey C. Shearer, Albany, NY (US); Su Chen Fan, Cohoes, NY (US); Heng Wu, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/125,775

(22) Filed: Dec. 17, 2020

(65) Prior Publication Data
US 2022/0199785 A1 Jun. 23, 2022

(51) Int. Cl.
H01L 29/40 (2006.01)
H01L 29/08 (2006.01)
H01L 29/417 (2006.01)
H01L 29/66 (2006.01)
H01L 29/78 (2006.01)

(52) U.S. Cl.
CPC ........ H01L 29/401 (2013.01); H01L 29/0847 (2013.01); H01L 29/41741 (2013.01); H01L 29/66666 (2013.01); H01L 29/7827 (2013.01)

(58) Field of Classification Search
CPC .............. H01L 29/401; H01L 29/0847; H01L 29/41741; H01L 29/66666; H01L 29/782
USPC ........................................................ 257/329
See application file for complete search history.

(56) References Cited

U.S. PATENT DOCUMENTS

| 9,425,310 B2 | 8/2016 | Yang |
| 9,443,769 B2 | 9/2016 | Wang |
| 9,443,982 B1 | 9/2016 | Balakrishnan |
| 9,735,253 B1 | 8/2017 | Bi |

(Continued)

FOREIGN PATENT DOCUMENTS

WO    2022128268 A1    6/2022

OTHER PUBLICATIONS

International Searching Authority, "Notification of International Search Report and Written Opinion or Declaration", International Application No. PCT/EP2021/081298, dated Feb. 11, 2022, 12 pages.

Primary Examiner — Mohammad M Hoque
(74) Attorney, Agent, or Firm — Michael A. Petrocelli

(57) ABSTRACT

A semiconductor structure and a method of making the same includes a first recessed region in a semiconductor structure, the first recessed region defining a first opening with a first positive tapering profile, as at least part of the first positive tapering profile, widening the first opening in a direction towards a top source/drain region of the semiconductor structure at a first tapering angle, and a top source/drain contact within the first opening, the top source/drain contact surrounding a surface of the top source/drain region. The semiconductor structure further includes a protective liner located at an interface between a bottom portion of the top source/drain region, a top spacer adjacent to the top source/drain region and a dielectric material between two consecutive top source/drain regions, the protective liner protects the top source/drain regions during contact patterning.

7 Claims, 10 Drawing Sheets

(56) References Cited

U.S. PATENT DOCUMENTS

| | | | |
|---|---|---|---|
| 9,825,032 B1* | 11/2017 | Bentley | H01L 21/743 |
| 9,929,246 B1 | 3/2018 | Cheng | |
| 10,224,431 B2 | 3/2019 | Cheng | |
| 10,396,208 B2 | 8/2019 | Cheng | |
| 10,483,361 B1 | 11/2019 | Lee | |
| 2015/0311082 A1* | 10/2015 | Bouche | H01L 29/785 |
| | | | 257/288 |
| 2015/0340467 A1* | 11/2015 | Bouche | H01L 29/41791 |
| | | | 438/283 |
| 2017/0317210 A1* | 11/2017 | Anderson | H01L 21/823487 |
| 2017/0373159 A1 | 12/2017 | Cheng | |
| 2018/0090582 A1 | 3/2018 | Adusumilli | |
| 2018/0263684 A1* | 9/2018 | Lee | H01L 21/76831 |
| 2018/0269306 A1* | 9/2018 | Bao | H01L 29/0847 |
| 2019/0088778 A1 | 3/2019 | Kawamura | |
| 2019/0157452 A1* | 5/2019 | Kim | H01L 23/5329 |
| 2020/0091317 A1 | 3/2020 | Cheng | |
| 2020/0119180 A1* | 4/2020 | Frougier | H01L 21/823418 |
| 2021/0226021 A1* | 7/2021 | Hung | H01L 21/28518 |
| 2021/0296178 A1 | 9/2021 | Xie | |

* cited by examiner

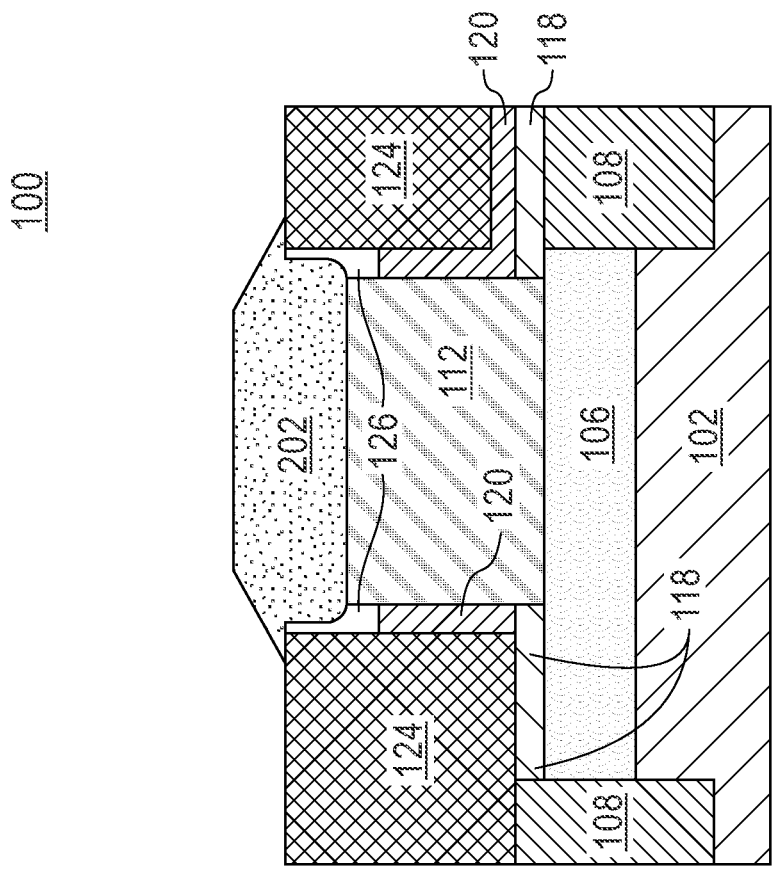
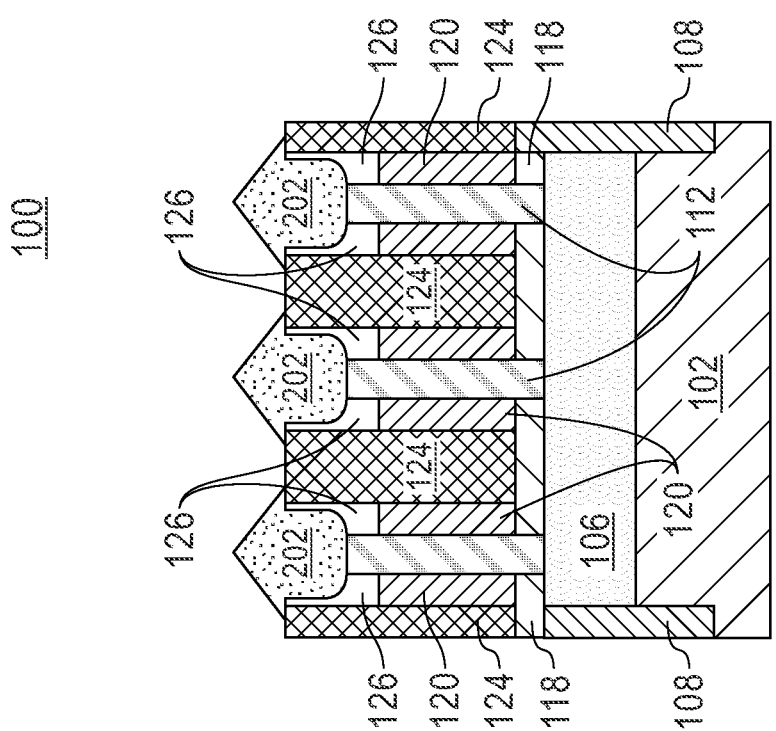
FIG. 2A
FIG. 2B

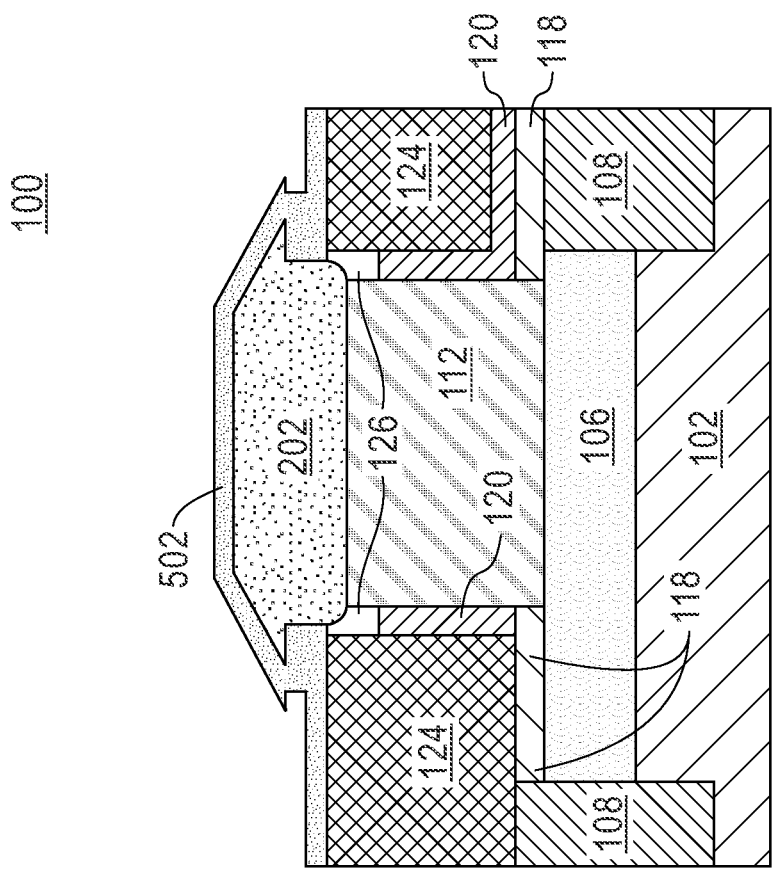
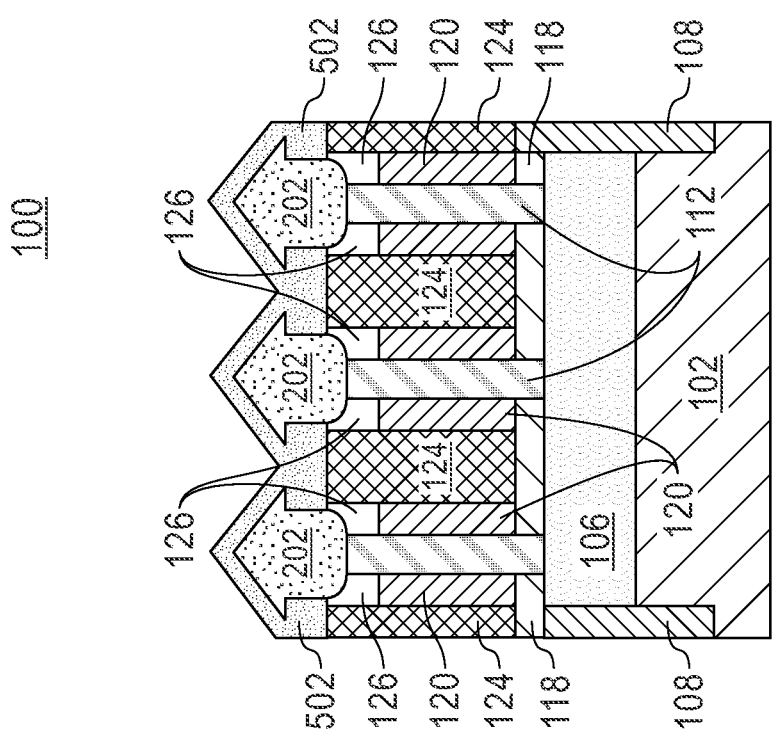
FIG. 5A
FIG. 5B

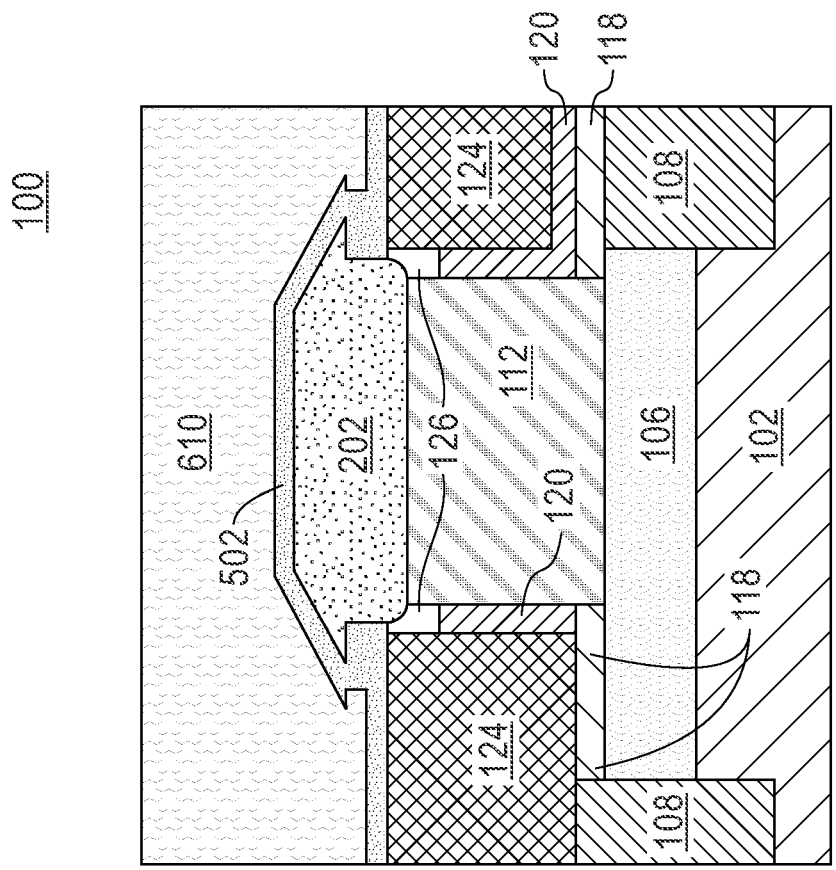
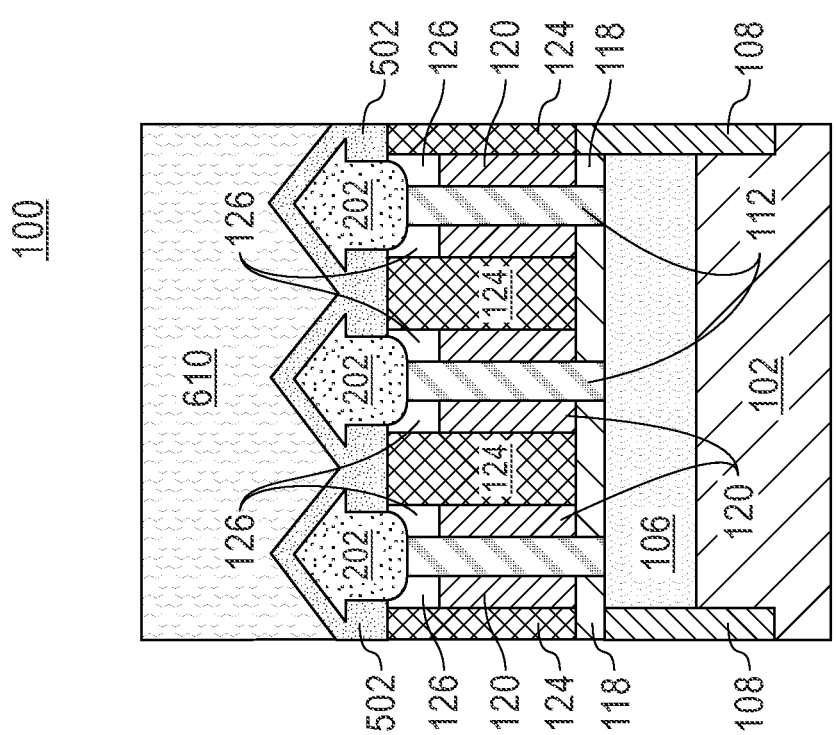
FIG. 6A
FIG. 6B

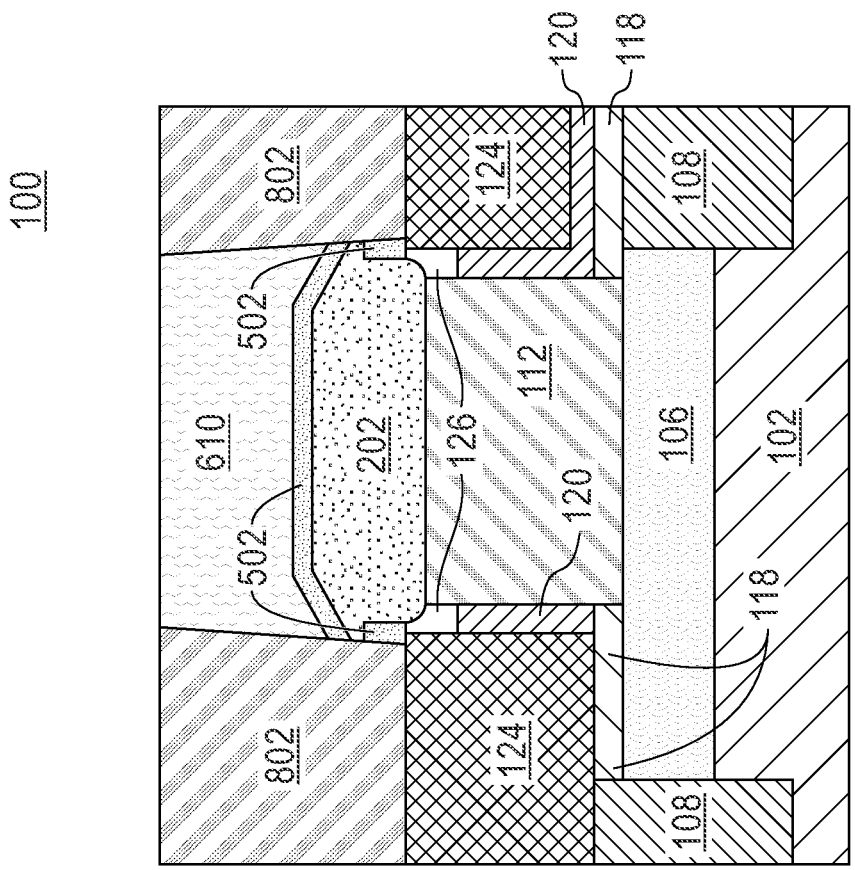
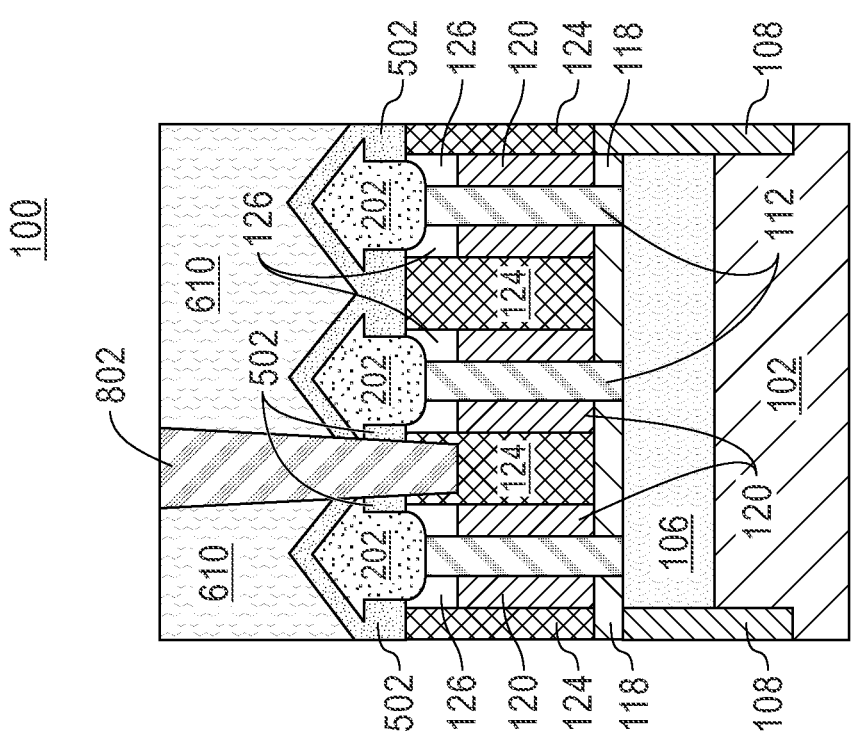
FIG. 8A
FIG. 8B

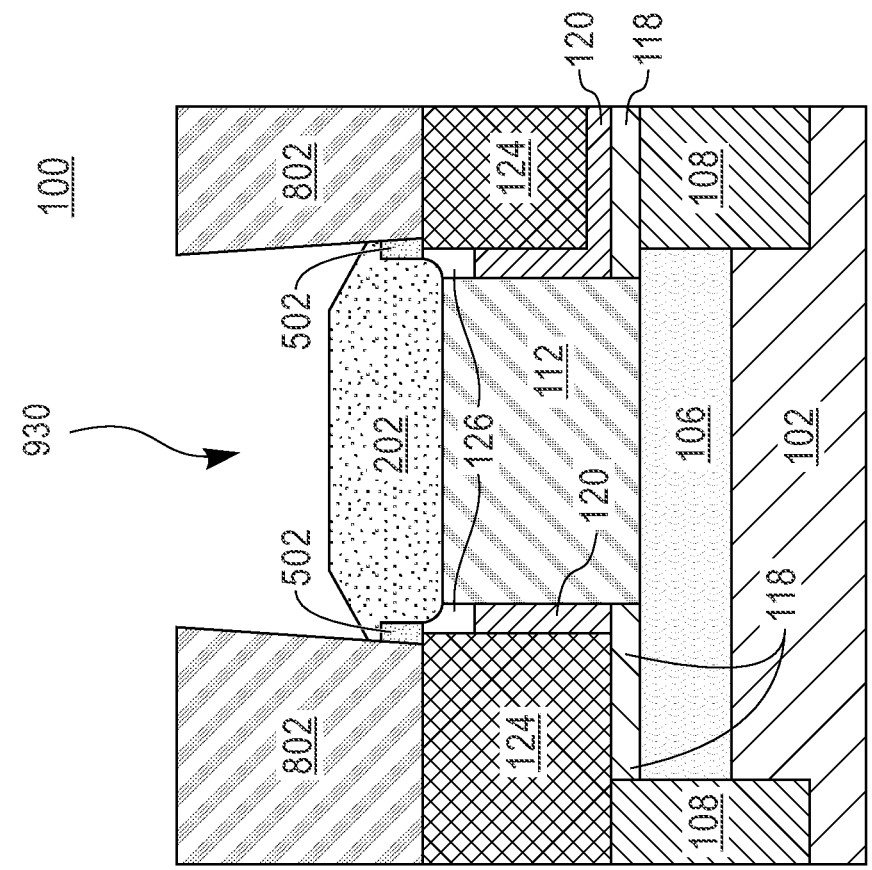
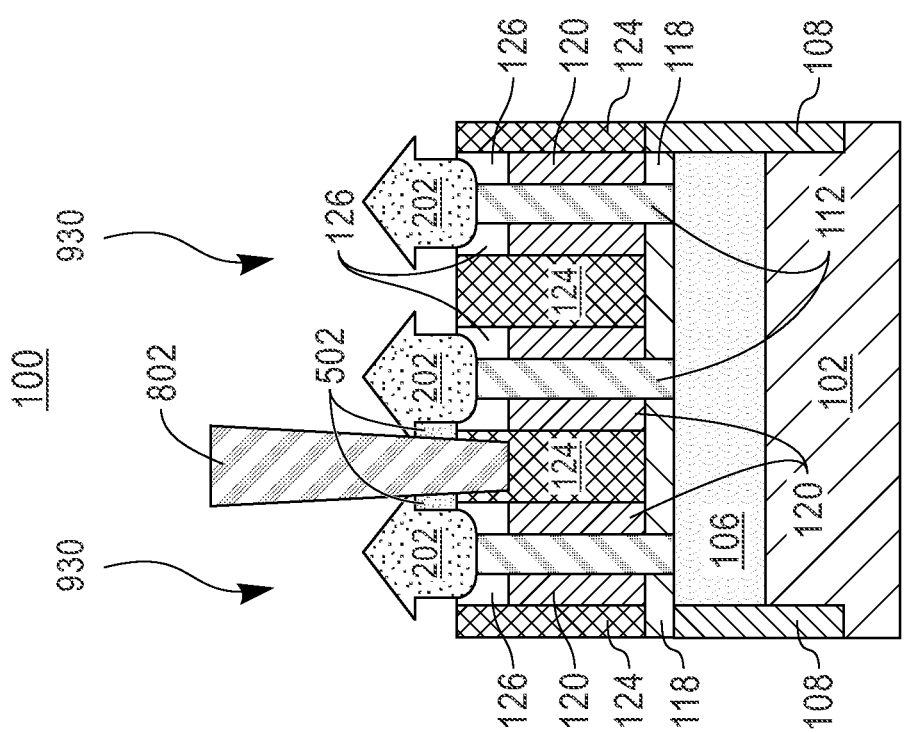
FIG. 9A
FIG. 9B

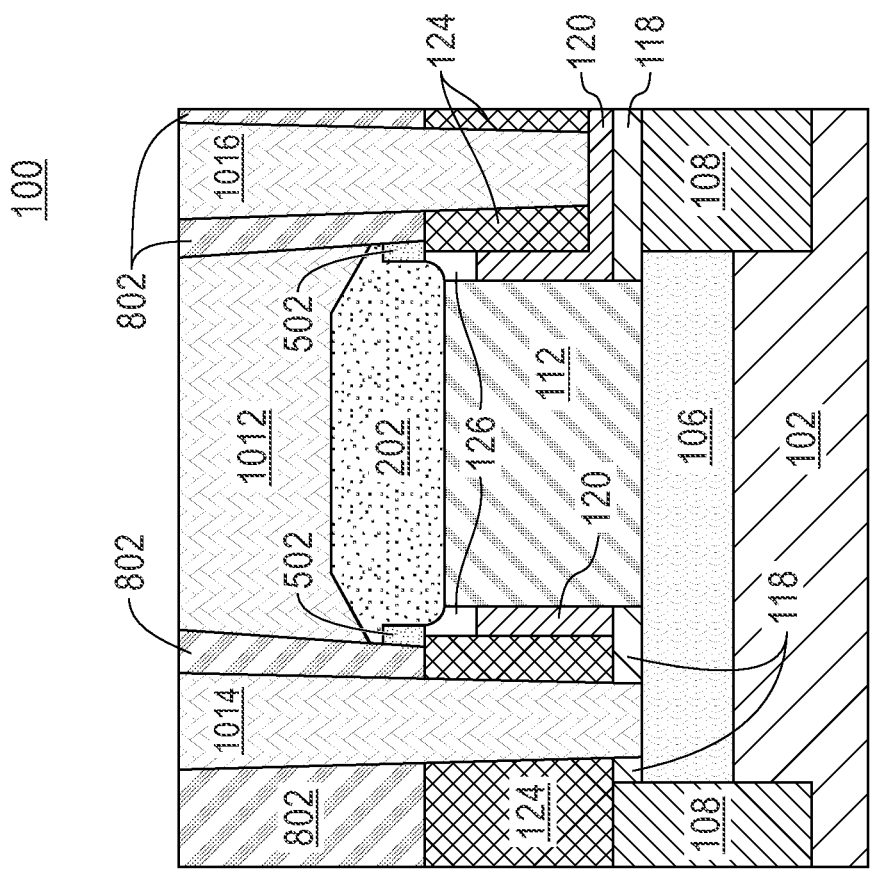
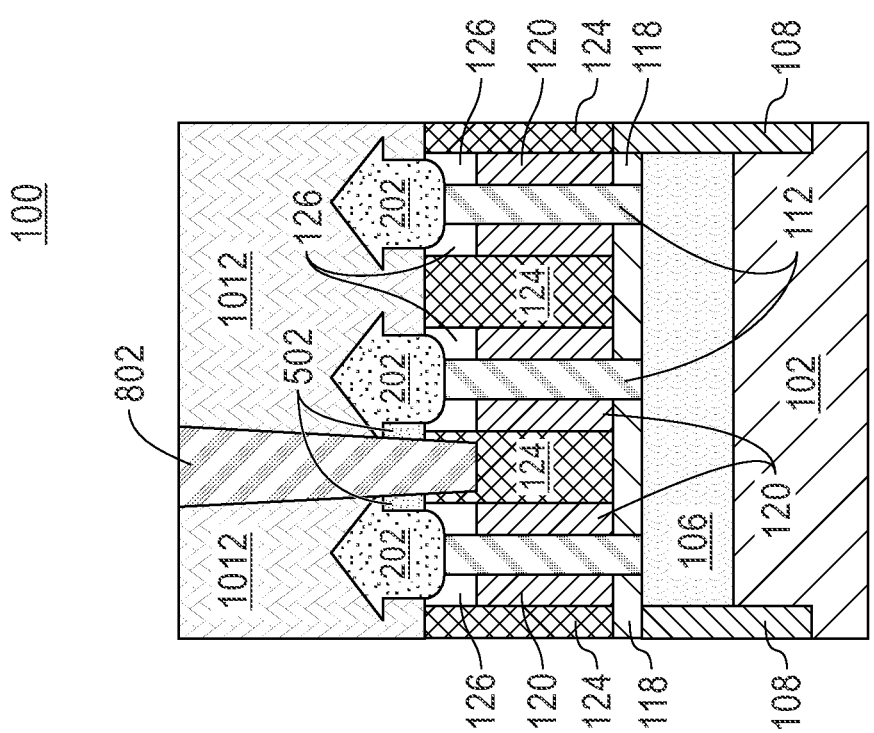

WRAPPED-AROUND CONTACT FOR VERTICAL FIELD EFFECT TRANSISTOR TOP SOURCE-DRAIN

BACKGROUND

The present invention generally relates to the field of semiconductor devices, and more particularly to a method of forming a source/drain contact surrounding top source/drain regions in vertical field-effect transistors (VFETs).

VFETs have been pursued as a potential device option for scaling complementary metal-oxide semiconductors (CMOS) to the 5 nanometer (nm) node and beyond. As opposed to planar CMOS devices, VFETs are oriented vertically with a vertical fin or nanowire that extends upward from the substrate. The fin or nanowire forms the channel region of the transistor. A source region and a drain region are situated in electrical contact with the top and bottom ends of the channel region, while the gate is disposed on one or more of the fin or nanowire sidewalls. Thus, in VFETs the direction of the current flow between the source and drain regions is normal to the main surface of the substrate.

In current VFET integration schemes, top source/drain contact (CA) over etch is performed to achieve the desired contact dimensions and ensure good contact landing. However, during this process over etching of the dielectric material between epi regions can occur causing CA to gate shorts.

SUMMARY

According to an embodiment, a method of forming a semiconductor structure includes forming a first recessed region in a semiconductor structure, the first recessed region defining a first opening with a first positive tapering profile, as at least part of the first positive tapering profile, widening the first opening in a direction towards a top source/drain region of the semiconductor structure at a first tapering angle; and forming a top source/drain contact within the first opening, the top source/drain contact surrounding a surface of the top source/drain region.

According to another embodiment, a method of forming a semiconductor structure includes forming a top source/drain region in contact with a top surface of a channel fin extending vertically from a bottom source/drain region located above a substrate, a top spacer separates the top source/drain region from a high-k metal gate stack located around the channel fin, the channel fin and the top spacer are in contact with an adjacent first interlevel dielectric layer located directly above the bottom source/drain region, recessing the first interlevel dielectric layer to expose a top portion of the top source/drain region and top portions of the top spacer adjacent to the top source/drain region, selectively removing the exposed top portions of the of the top spacer to expose a bottom portion of the top source/drain region, and conformally depositing a protective liner above and in direct contact with the top source/drain region.

According to yet another embodiment, a semiconductor structure includes a first region including a first positive tapering profile, the first positive tapering profile includes a first tapering angle widening in a direction towards a top source/drain region of the semiconductor structure, and a top source/drain contact within the first region, the top source/drain contact surrounding a surface of the top source/drain region.

BRIEF DESCRIPTION OF THE DRAWINGS

The following detailed description, given by way of example and not intended to limit the invention solely thereto, will best be appreciated in conjunction with the accompanying drawings, in which:

FIG. 2A is a cross-sectional view of the semiconductor structure after forming a top source/drain region, according to an embodiment of the present disclosure;

FIG. 2B is a lateral view of the semiconductor structure taken along the Y-plane;

FIG. 5A is a cross-sectional view of the semiconductor structure after depositing a protective liner, according to an embodiment of the present disclosure;

FIG. 5B is a lateral view of the semiconductor structure taken along the Y-plane;

FIG. 6A is a cross-sectional view of the semiconductor structure depicting depositing a sacrificial material, according to an embodiment of the present disclosure;

FIG. 6B is a lateral view of the semiconductor structure taken along the Y-plane;

FIG. 8A is a cross-sectional view of the semiconductor structure after depositing a second interlevel dielectric layer and removing the organic planarization layer, according to an embodiment of the present disclosure;

FIG. 8B is a lateral view of the semiconductor structure taken along the Y-plane;

FIG. 9A is a cross-sectional view of the semiconductor structure after removing the sacrificial material, according to an embodiment of the present disclosure;

FIG. 9B is a lateral view of the semiconductor structure taken along the Y-plane;

FIG. 10A is a cross-sectional view of the semiconductor structure after middle-of-line contact metallization, according to an embodiment of the present disclosure; and FIG. 10B is a lateral view of the semiconductor structure taken along the Y-plane.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1B:
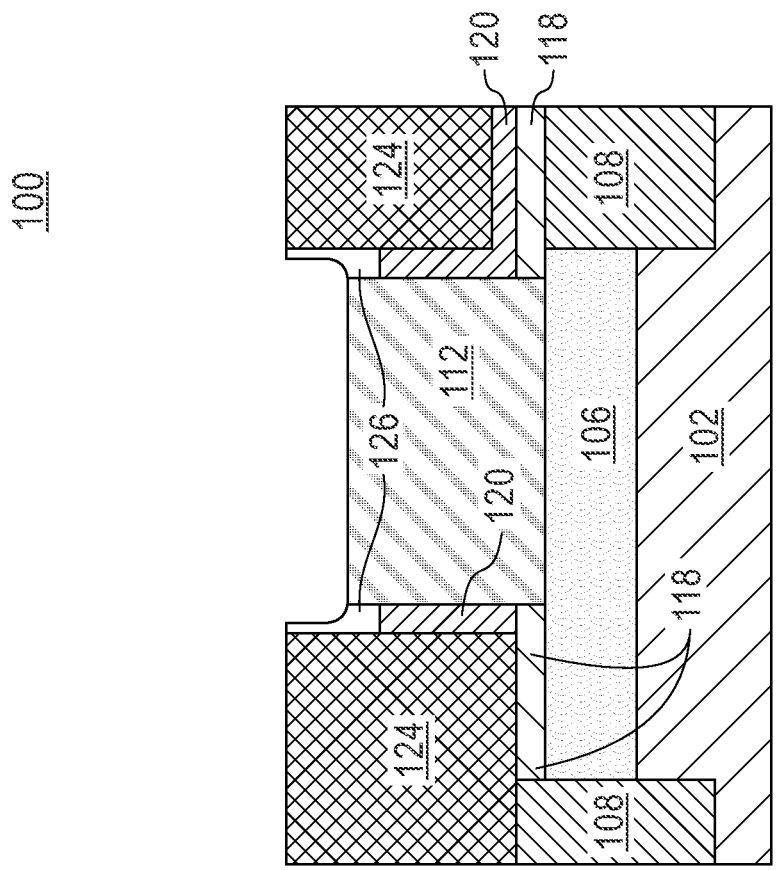
FIG. 1B is a lateral view of the semiconductor structure taken along the Y-plane.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Some non-planar transistor device architectures, such as VFETs, employ semiconductor fins and side-gates that can be contacted outside the active region, resulting in increased device density over lateral devices. In VFETs the source to drain current flows in a direction that is perpendicular to a major surface of the substrate. For example, in a known VFET configuration a major substrate surface is horizontal and a vertical fin extends upward from the substrate surface. The fin forms the channel region of the transistor. A source/drain region is situated in electrical contact with the top and bottom ends of the channel region (i.e., top source/drain region and bottom source/drain region), while a gate is disposed on one or more of the fin sidewalls. Contact patterning processes are conducted to form metal contacts to top source/drain region (CA contacts), bottom source/drain region (CR contacts), and gate (CB contacts).

In current VFET integration schemes, CA over etch is performed to achieve the desired contact dimensions and ensure good contact landing. However, during this process over etching of the dielectric material between epi regions can occur causing CA to gate shorts. CA etching can easily punch-through the dielectric material, particularly when weak points are present in the dielectric material. If CA over etching is not performed, the contact size may be too small. Possible solutions for a reduced CA contact size may include (1) increasing a size of the top epi region, and/or (2) increasing a size of the CA contact to cover a surface of the top epi region. Both (1) and (2) can cause device shorts.

Therefore, embodiments of the present invention provides a method and associated structure for forming a VFET device having a top source/drain contact surrounding a surface of the top source/drain region(s) with a protective liner located at an interface between a bottom portion of the top source/drain region, a top spacer adjacent to the top source/drain region and a dielectric material between two consecutive top source/drain regions. By forming the protective liner, over etching of the dielectric material located between adjacent top source/drain regions does not expose the top source/drain during contact patterning, thus preventing contact shorts and improving device reliability. An embodiment by which the VFET device with wrapped around top contact and protective liner can be formed is described in detailed below by referring to the accompanying drawings in FIGS. 1A-10B.

Figure 1A:
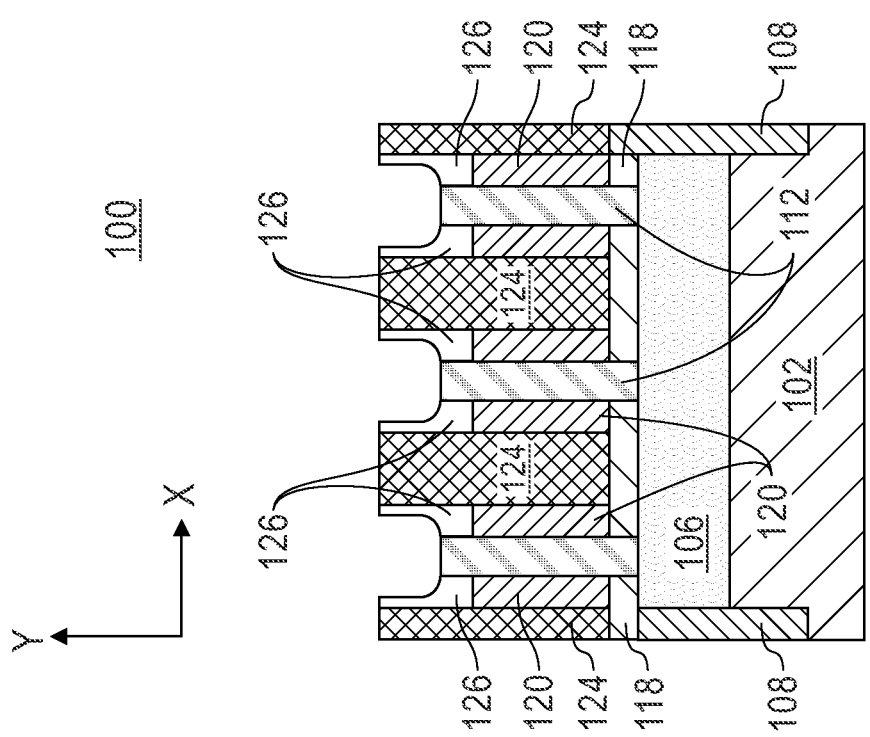
FIG. 1A is a cross-sectional view of a semiconductor structure at an intermediate step during a semiconductor manufacturing process, according to an embodiment of the present disclosure.

Referring now to FIG. 1A, a cross-sectional view of a semiconductor structure 100 is shown, according to an embodiment of the present disclosure. In this embodiment, FIG. 1B is a lateral view of the semiconductor structure 100 taken along the Y-axis, specifically along a channel fin 112.

Known semiconductor fabrication operations have been used to form the semiconductor structure 100. At this step of the manufacturing process, the semiconductor structure 100 includes a bottom S/D region 106 formed over a substrate 102, channel fin 112 formed over the bottom S/D region 106, bottom spacer 118 formed on opposed ends of the channel fin 112, a high-k metal gate stack 120 disposed on (adjacent) opposed ends of the channel fin 112 and above the bottom spacer 118, a first interlevel dielectric (ILD) layer 124, a top spacer 126 over the high-k metal gate stack 120 and on (adjacent) opposed ends of the channel fin 112, and a shallow trench isolation region (STI) 108 configured and arranged as shown in the figure.

The various elements that form the semiconductor structure 100 extend along a first axis (e.g., X-axis) to define width dimensions, and extend along a second axis (e.g., Y-axis) perpendicular to the X-axis to define height (or thickness) dimensions. Although not specifically depicted in the cross-sectional views shown in FIGS. 1A-1B, the various elements that form the semiconductor structure 100 also extend along a third axis (e.g., Z-axis) perpendicular to the first axis and the second axis to define depth dimensions. In accordance with standard VFET architectures, various elements of the semiconductor structure 100 (e.g., bottom spacer 118, high-k metal gate stack 206, etc.) extend completely around the sidewalls of the channel fin 112 in the X, Y, and Z directions.

With continued reference to FIGS. 1A-1B, the substrate 102 can be any suitable substrate material, such as, for example, monocrystalline Si, SiGe, SiC, III-V compound semiconductor, II-VI compound semiconductor, or semiconductor-on-insulator (SOI). In some embodiments, the substrate 102 includes a buried oxide layer (not depicted). In some embodiments, the bottom S/D region 106 can be formed before the channel fin 112. In some embodiments, the bottom S/D region 106 is epitaxially grown after formation of the channel fin 112, and the necessary doping to form the bottom S/D region 106 is provided through in-situ doping during the epitaxial growth process, or through ion implantation after the bottom S/D region 106 is formed. The bottom S/D region 106 can be formed by any suitable doping technique, including but not limited to, ion implantation, gas phase doping, plasma doping, plasma immersion ion implantation, cluster doping, infusion doping, liquid phase doping, solid phase doping, in-situ epitaxy growth, or any suitable combination of those techniques.

Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, germanium, and/or carbon doped silicon (Si:C) can be doped during deposition (in-situ doped) by adding dopants, n-type dopants (e.g., phosphorus or arsenic) or p-type dopants (e.g., boron or gallium), depending on the type of transistor. The dopant concentration in the bottom S/D region 106 can range from $1\times10^{19}$ cm$^{-3}$ to $2\times10^{21}$ cm$^3$, or preferably between $2\times10^{20}$ cm$^{-3}$ and $1\times10^{21}$ cm$^{-3}$.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial silicon (Si) layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

As depicted in the figure, the substrate 102 further includes STI region 108. Shallow trench isolation regions, such as the STI region 108, are frequently used in semiconductor technology to separate active regions within the substrate 102 and prevent electric current leakage between adjacent components. The process of forming the STI region(s) 108 is well known in the art, and generally include etching the substrate 102 to create recesses that may later be filled with an insulator material using any deposition method known in the art. In some embodiments, the STI region 108 may consist of any low-k dielectric material including, but not limited to, silicon nitride, silicon oxide, silicon oxynitride and fluoride-doped silicate glass.

Bottom spacer 118 is formed across from the doped S/D region 106 and adjacent to a bottom portion of the channel fin 112. The bottom spacer 118 can include a dielectric material, such as, for example, SiN, SiC, SiOC, SiCN, BN, SiBN, SiBCN, SiOCN, SiOxNy, and combinations thereof. The dielectric material can be a low-k material having a dielectric constant less than about 7, less than about 5, or even less than about 2.5. The bottom spacer 118 can be formed using combinations of known deposition and etching processes, such as, for example, chemical vapor deposition (CVD), plasma-enhanced chemical vapor deposition (PECVD), atomic layer deposition (ALD), physical vapor deposition (PVD), chemical solution deposition, and etching processes including reactive ion etch (RIE), wet etch, or isotropic vapor phased dry etch.

As illustrated in the figure, the high-k metal gate stack 120 is formed in direct contact with the channel fin 112. For ease of illustration, the high-k metal gate stack 120 is depicted as only one layer. However, as known by those skilled in the art, the high-k metal gate stack 120 can include a gate dielectric and a gate conductor/metal (e.g., a work function metal (WFM)) deposited over the bottom spacer 118 and adjacent to a portion of the channel fin 112. In some embodiments, the high-k metal gate stack 120 is deposited by ALD.

The gate dielectric (not shown) can be formed from one or more gate dielectric films. The gate dielectric films can be a dielectric material having a dielectric constant greater than, for example, 3.9, 7.0, or 10.0. Non-limiting examples of suitable materials for the high-k dielectric films include oxides, nitrides, oxynitrides, silicates (e.g., metal silicates), aluminates, titanates, nitrides, or any combination thereof. Examples of high-k materials with a dielectric constant greater than 7.0 include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The gate dielectric films can further include dopants such as, for example, lanthanum and aluminum. The gate dielectric films can be formed by suitable deposition processes, for example, CVD, PECVD, ALD, PVD, chemical solution deposition, or other like processes. The thickness of the gate dielectric films can vary depending on the deposition process as well as the composition and number of high-k dielectric materials used.

The gate conductor (not shown) in the high-k metal gate stack 120 can include doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. In some embodiments, the gate conductor can be a WFM deposited over the gate dielectric films by a suitable deposition process, for example, CVD, PECVD, PVD, plating, thermal or e-beam evaporation, and sputtering. The type of WFM depends on the type of transistor and can differ between n-FET and p-FET devices. P-type WFMs include compositions such as titanium nitride (TiN), ruthenium, palladium, platinum, cobalt, nickel, and conductive metal oxides, or any combination thereof. N-type WFMs include compositions such as titanium carbide (TiC), titanium aluminum carbide (TiAlC), hafnium, zirconium, titanium, tantalum, aluminum, metal carbides (e.g., hafnium carbide, zirconium carbide, titanium carbide, and aluminum carbide), aluminides, or any combination thereof. The gate conductor can further include a tungsten (W), titanium (Ti), aluminum (Al), cobalt (Co), or nickel (Ni) material over the WFM layer of the gate conductor. The gate conductor can be deposited by a suitable deposition process, for example, CVD, PECVD, PVD, plating, thermal or e-beam evaporation, and sputtering.

In this embodiment, the high-k metal gate stack 120 is conformally deposited on the semiconductor structure 100. After deposition of the high-k metal gate stack 120, a patterning process is conducted on the semiconductor structure 100 to etch the unwanted high-k metal gate stack 120.

The first ILD layer 124 is formed to fill voids between gate structures and other existing devices within the semiconductor structure 100. The first ILD layer 124 may be formed by, for example, CVD of a dielectric material. Non-limiting examples of dielectric materials to form the first ILD layer 124 may include silicon oxide, silicon nitride, hydrogenated silicon carbon oxide, silicon based low-k dielectrics, flowable oxides, porous dielectrics, or organic dielectrics including porous organic dielectrics.

Typically, after deposition of the first ILD layer 124, a chemical mechanical polishing (CMP) process is conducted in the semiconductor structure 100 to expose a top surface of the channel fin 112.

With continued reference to FIGS. 1A-1B, in some embodiments, after a fin hardmask (not shown) is removed, the high-k metal gate stack 120 can be recessed below a top surface of the channel fin 112, as shown in the figure. After that, the top spacer 126 can be conformally deposited above and in direct contact with the high-k metal gate stack 120. In such embodiments, the top spacer 126 may be deposited using, for example, CVD, PECVD, radio-frequency CVD (RFCVD), PVD, ALD, molecular layer deposition (MLD), molecular beam deposition (MBD), pulsed laser deposition (PLD), liquid source misted chemical deposition (LSMCD), sputtering, and/or plating. Non-limiting examples of materials forming the top spacer 126 may include silicon nitride (SiN), silicon boron nitride (SiBN), siliconborocarbonitride (SiBCN), or silicon oxycarbonitride (SiOCN). Any suitable etching technique (e.g., RIE) may be used to remove the top spacer 126 from top surfaces of the channel fin 112, as depicted in the figure, prior to deposition of the first ILD layer 124.

It should be noted that although bottom spacer 118 and top spacer 126 are depicted on adjacent opposite sides of the channel fin 112, the bottom spacer 118 and the top spacer 126 surround an entire surface of the channel fin 112. The bottom spacer 118 and the top spacer 126 may determine a location of p-n junctions in the semiconductor structure 100.

Referring now to FIG. 2A, a cross-sectional view of the semiconductor structure 100 after forming top S/D region 202 is shown, according to an embodiment of the present disclosure. In this embodiment, FIG. 2B is a lateral view of the semiconductor structure 100 taken along the Y-axis.

At this point of the manufacturing process, top S/D region 202 can be formed off the exposed portion of the channel fin 112 following steps similar to the ones described above with respect to the bottom S/D region 106. As may be known by those skilled in the art, the diamond shape observed in the top S/D region 202 may be a consequence of the different growth rates during the epitaxial deposition process inherent to each crystallographic orientation plane of the material forming the top S/D region 202. In other embodiments, the top S/D region 202 may have a shape other than the diamond shape depicted in FIG. 2A. It should be noted that although reference to the top S/D region 202 and channel fin 112 is done in singular form, more than one top S/D region 202 and more than one channel fin 112 can exist in the semiconductor structure 100, as illustrated in the figure.

Figure 3B:
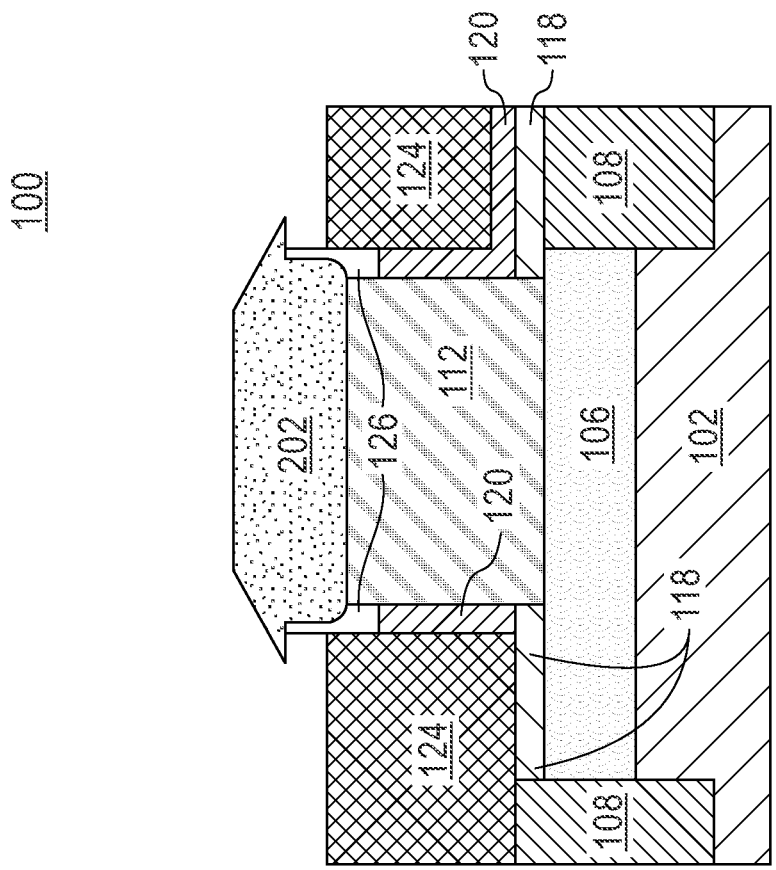
FIG. 3B is a lateral view of the semiconductor structure taken along the Y-plane.
Figure 3A:
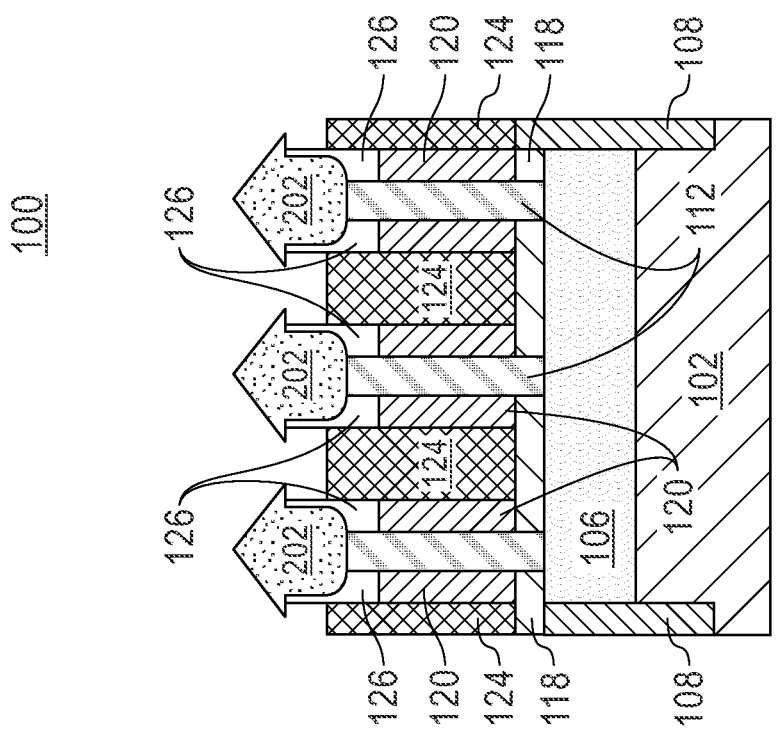
FIG. 3A is a cross-sectional view of the semiconductor structure after recessing a first interlevel dielectric layer, according to an embodiment of the present disclosure.

Referring now to FIG. 3A, a cross-sectional view of the semiconductor structure 100 after recessing the first ILD layer 124 is shown, according to an embodiment of the present disclosure. In this embodiment, FIG. 3B is a lateral view of the semiconductor structure 100 taken along the Y-axis.

As shown in the figure, recessing of the first ILD layer 124 exposes a top portion of the top S/D region 202 and top portions of the top spacer 126 adjacent to the top S/D region 202. According to an embodiment, recessing of the first ILD layer 124 is achieved by conducting a blanket atomic layer etching (ALE) on the dielectric material forming the first ILD layer 124. ALE etching may provide high selectivity, since dose gas and ion energy can be tailored to minimize etching of mask layers or underlying materials.

It should be noted that to ensure good contact landing in current VFET integration schemes, over etch of the ILD (i.e., first ILD layer 124) located between top epitaxial regions (i.e., top S/D region 202) can occur during typical RIE processes, this facilitates CA to gate shorts. This is particularly true in cases in which weak points can be present in the dielectric material. Thus, by using a blank ALE etching instead of the traditional RIE, precise control of etching depth can be achieved to avoid over etching the first ILD layer 124 and prevent CA to gate shorts. It should also be noted that, in an embodiment, any selective ILD etch process can be used to recess the ILD with respect to the surrounding material, such as selective wet etch using BHF or DHF or selective dry etch.

Figure 4A:
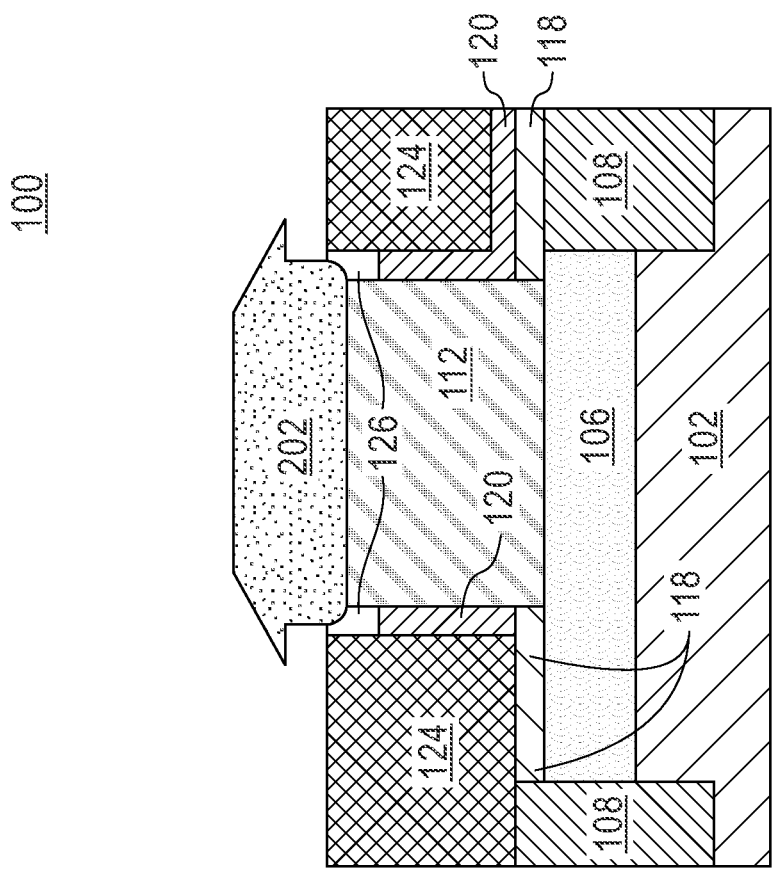
FIG. 4A is a cross-sectional view of the semiconductor structure depicting selectively removing exposed portions of a top spacer, according to an embodiment of the present disclosure.
Figure 4B:
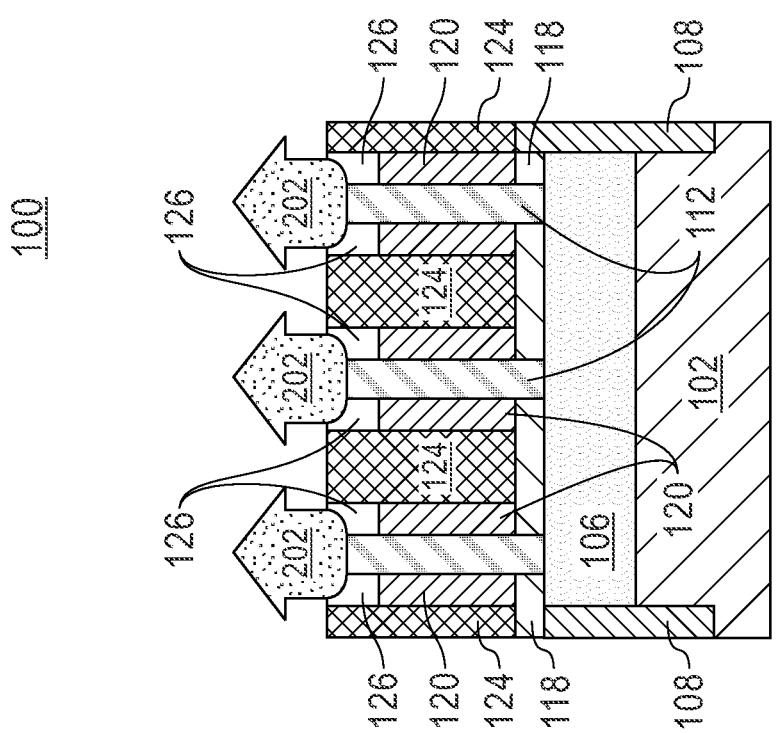
FIG. 4B is a lateral view of the semiconductor structure taken along the Y-plane.

Referring now to FIG. 4A, a cross-sectional view of the semiconductor structure 100 depicting selectively removing exposed portions of the top spacer 126 is shown, according to an embodiment of the present disclosure. In this embodiment, FIG. 4B is a lateral view of the semiconductor structure 100 taken along the Y-axis.

After recessing the first ILD layer 124, portions of the top spacer 126 are exposed as can be appreciated in FIGS. 3A-3B. In this embodiment, exposed portions of the top spacer 126 are selectively removed using any suitable etching technique. In an exemplary embodiment, a [selective wet etch process such as hot phosphorous or a selective dry etch process can be used to remove the top spacer.

Referring now to FIG. 5A, a cross-sectional view of the semiconductor structure 100 after depositing a (sacrificial) protective liner 502 is shown, according to an embodiment of the present disclosure. In this embodiment, FIG. 5B is a lateral view of the semiconductor structure 100 taken along the Y-axis.

According to an embodiment, the protective liner 502 includes a material such as titanium (Ti), titanium oxide (TiOx), and/or titanium nitride (TiN). The protective liner 502 protects the top S/D region 202 during the contact patterning process, as will be described in detail below. The protective liner 502 is conformally deposited on the semiconductor structure 100, above and in direct contact with top S/D region(s) 202, first ILD layer 124, and top spacer 126, as illustrated in the figure. The protective liner 502 may be formed by any suitable deposition technique such as, for example, ALD. According to an embodiment, a thickness of the protective liner 502 may vary from approximately 5 nm to approximately 20 nm.

Referring now to FIG. 6A, a cross-sectional view of the semiconductor structure 100 depicting depositing a sacrificial material 610 is shown, according to an embodiment of the present disclosure. In this embodiment, FIG. 6B is a lateral view of the semiconductor structure 100 taken along the Y-axis.

The sacrificial material 610 is formed in the semiconductor structure 100 for defining a contact placeholder. In an embodiment, the sacrificial material 610 includes an amorphous silicon (a-Si) layer. In other embodiments, the sacrificial material 610 can include materials such as SiGe, TiOx, AlOx, room temperature oxide, and the like. The sacrificial material 610 may be deposited using standard deposition processes such as PECVD. A thickness of the sacrificial material 610 may vary from approximately 20 nm to approximately 100 nm.

Figure 7A:
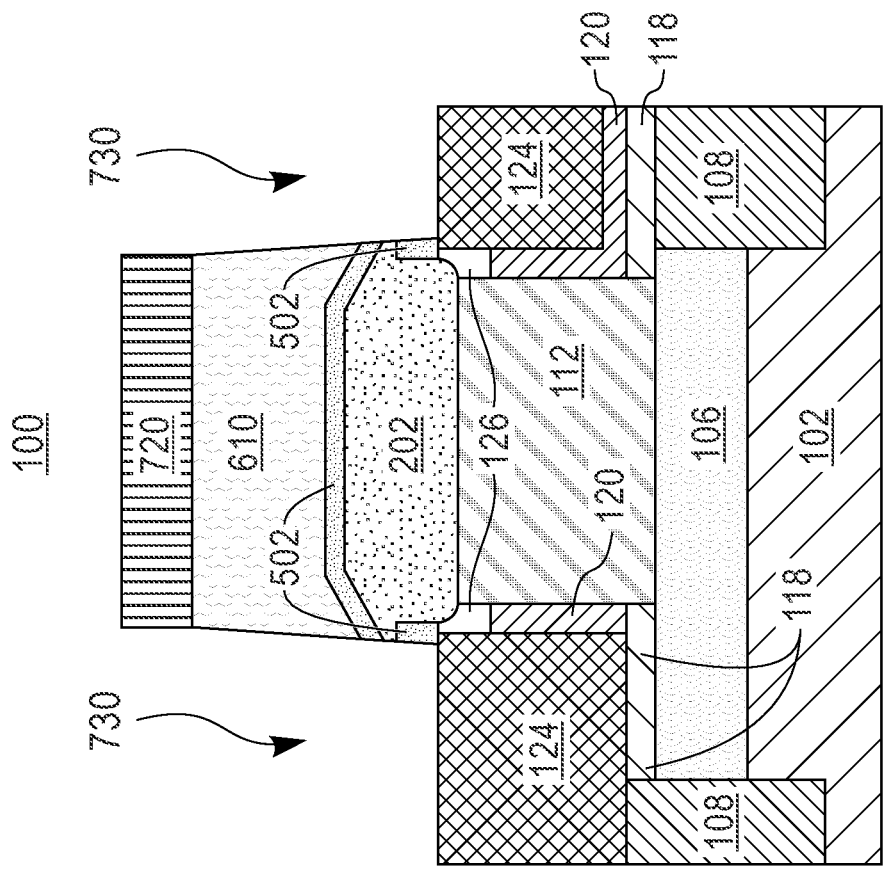
FIG. 7A is a cross-sectional view of the semiconductor structure after deposition of an organic planarization layer and contact patterning, according to an embodiment of the present disclosure.

Referring now to FIG. 7A, a cross-sectional view of the semiconductor structure 100 depicting deposition of a an organic planarization layer (OPL) 720 and contact patterning is shown, according to an embodiment of the present disclosure. In this embodiment, FIG. 7B is a lateral view of the semiconductor structure 100 taken along the Y-axis.

The OPL 720 is formed directly above the sacrificial material 610. OPL can be made of any organic planarizing material that is capable of effectively preventing damage of underlying layers during subsequent etching processes. According to an embodiment, the OPL 720 allows for better depth controllability during the contact patterning process. The OPL 720 can include, but is not necessarily limited to, an organic polymer including C, H, and N. According to an embodiment, the OPL material can be free of silicon (Si). According to another embodiment, the OPL material can be free of Si and fluorine (F). As defined herein, a material is free of an atomic element when the level of the atomic element in the material is at or below a trace level detectable with analytic methods available in the art. Non-limiting examples of the OPL material forming the OPL 720 can include JSR HM8006, JSR HM8014, AZ UM10M2, Shin Etsu ODL 102, or other similar commercially available materials. The OPL 720 may be deposited by, for example, spin coating followed by a planarization process, such as CMP.

Figure 7B:
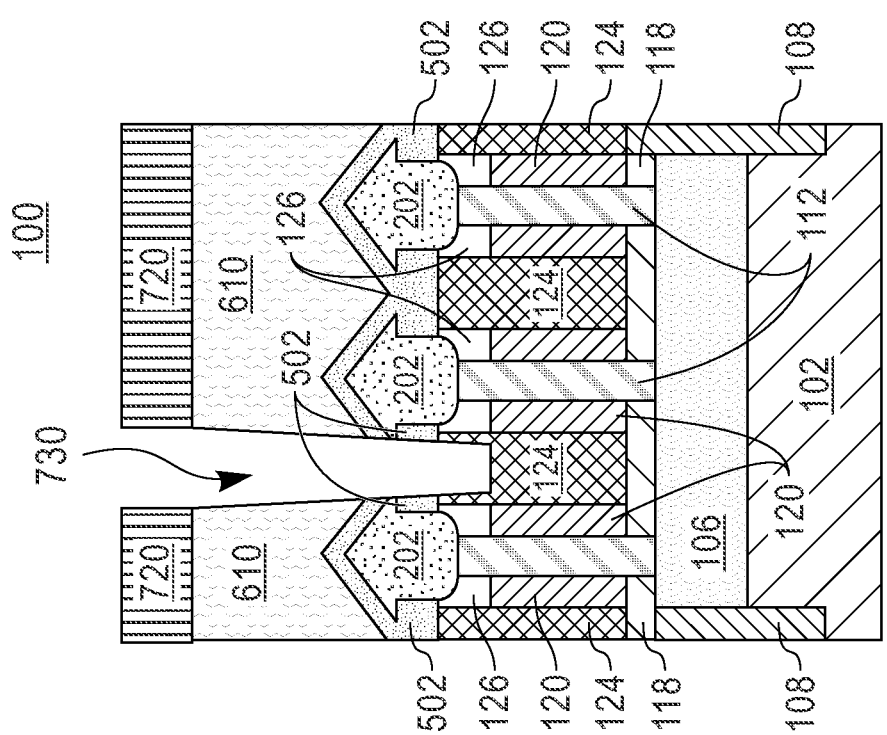
FIG. 7B is a lateral view of the semiconductor structure taken along the Y-plane.

With continued reference to FIGS. 7A-7B, a lithography process followed by an etching process is conducted on the semiconductor structure 100 for etching the OPL 720, the sacrificial material 610, the protective liner 502 and a top portion of the first ILD layer 124, as shown in the figure. In some embodiments, etching the OPL 720, the sacrificial material 610, the protective liner 502, and the first ILD layer 124 involves a two-step process. For example, an OPL RIE including a trace point detection is conducted to etch the OPL 720 until a top portion of the protective liner 502. Then, the process continues with a time etch technique that allows recessing the protective liner 502 and the first ILD layer 124 until reaching a depth of approximately 5 nm to approximately 30 nm into the first ILD layer 124. Stated differently, etching of the protective liner 502 and the first ILD layer 124 is conducted until no protecting layer 502 exist at a bottom surface of first recesses (or trenches) 730 anywhere on the wafer, as illustrated in the figure. As can be observed, the first recesses 730 formed in the semiconductor structure 100 include a tapered angle for the subsequent formation of source/drain and gate contacts, as will be described in detail below.

It should be noted that by etching through the protective layer 502, top S/D region 202, and first ILD layer 124, top source/drain regions between adjacent devices or between top and bottom contacts within a device can be effectively separated, thus avoiding contact shorts.

Referring now to FIG. 8A, a cross-sectional view of the semiconductor structure 100 depicting depositing a second ILD layer 802 and removing the OPL 720 is shown, according to an embodiment of the present disclosure. In this embodiment, FIG. 8B is a lateral view of the semiconductor structure 100 taken along the Y-axis.

Exemplary techniques suitable for removing the OPL 720 may include, but are not limited to, oxygen plasma, nitrogen plasma, hydrogen plasma or other carbon strip or ashing process, which causes minimal or no damage to the underlying layers.

The second ILD layer 802 is deposited on the semiconductor structure 100 to substantially fill the first recesses 730 (FIGS. 7A-7B). The second ILD layer 802 may be made of analogous materials and formed in similar ways as the first ILD layer 124. In some embodiments, a planarization process may be conducted on the semiconductor structure 100 after deposition of the second ILD layer 802.

Referring now to FIG. 9A, a cross-sectional view of the semiconductor structure 100 after removing the sacrificial material 610 is shown, according to an embodiment of the present disclosure. In this embodiment, FIG. 9B is a lateral view of the semiconductor structure 100 taken along the Y-axis.

Standard etching techniques can be implemented to remove the sacrificial material 610. For example, in an embodiment, the sacrificial material 610 can be removed by hot ammonia wet etch. After removal of the sacrificial material 610, any exposed protective liner 502 can also be removed, for example, by wet SC1. Removal of the sacrificial material 610 and exposed protective liner 502 from the semiconductor structure 100 creates second recesses 930 for forming top source/drain contacts as will be described in detail below.

Referring now to FIG. 10A, a cross-sectional view of the semiconductor structure 100 after middle-of-line (MOL) contact metallization is shown, according to an embodiment of the present disclosure. In this embodiment, FIG. 10B is a lateral view of the semiconductor structure 100 taken along the Y-axis.

As illustrated in the figure, top source/drain contacts 1012 (i.e., CA contacts) extend all the way through the top S/D/region 202 while bottom source/drain contacts 1014 (i.e., CR contacts) extend all the way through the bottom S/D region 106. The process of forming metal contacts is standard and well-known in the art. Typically, the process includes patterning bottom S/D (CR) and gate contact trenches (CB) followed by filling trenches (i.e., second recesses 930 of FIGS. 9A-9B) formed in a dielectric layer such as the second ILD layer 802 and/or the first ILD layer 124 with a conductive material or a combination of conductive materials to form the top source/drain contacts 1012, bottom source/drain contacts 1014, and gate contacts 1016. The conductive material filling the top source/drain contacts 1012, bottom source/drain contacts 1014, and gate contacts 1016 includes a conductive metal, for example, aluminum (Al), platinum (Pt), gold (Au), tungsten (W), titanium (Ti), cobalt (Co), ruthenium (Ru), copper (Cu), or any combination thereof. It should be noted that, in some embodiments, an adhesion metal liner (not shown) may be used before conductive metal depth, such as TiN, TaN, etc. The conductive material may be deposited by a suitable deposition process, for example, CVD, PECVD, PVD, plating, thermal or e-beam evaporation, or sputtering. A planarization process such as CMP is generally performed to remove any conductive material from surfaces of the semiconductor structure 100.

As can be appreciated in FIG. 10B, according to an embodiment, the top S/D contacts 1012 have a positive tapering profile (i.e., top critical dimension (CD) is smaller than bottom CD) while bottom S/D contacts 1014 and gate contacts 1016 have a negative tapering profile (top CD is larger than bottom CD). As known by those skilled in the art, tapering includes a gradual thinning or narrowing towards one end. In the case of the top S/D contacts 1012 having a positive tapering angle in a direction towards the top S/D region 202, the thinning occurs in an opposite direction to the (epitaxial) top S/D region 202 while the widening occurs in a direction towards the top S/D region 202. In the case of the bottom S/D contacts 1014 and gate contacts 1016 having a negative tapering angle, the thinning occurs towards the (epitaxial) bottom S/D region 106 and the high-k metal gate stack 120, respectively. The different contact tapering profiles, may help avoiding very small separations happening at the same location (e.g., if all contacts are negative tapered, top CDs are largest, increasing the risk of having contact shorts at top S/D).

According to an embodiment, the top S/D contacts 1012 are formed wrapping around the top S/D region 202. Stated differently, the above steps allow for the conductive material forming the top S/D contacts 1012 to surround or enclosed a larger surface of the top S/D region(s) 202 (including sidewalls and bottom areas of the S/D epi surface).

It should be noted that a portion of the protective liner 502 remains in direct contact with a bottom portion of the top S/D region 202. Specifically, the protective liner 502 remains at an interface between the bottom portion of the top S/D region 202, top surfaces of the top spacer 126 adjacent to the top S/D region 202 and portions of the second ILD layer 802 located between two consecutive top S/D region(s) 202. As can be appreciated in FIG. 10B, the remaining portion of the protective liner 502 is disposed on opposing bottom sides of the top S/D region 202 (indicated by the circled region), by doing this over etching of the first ILD layer 124 between adjacent top S/D regions 202 does not expose the top S/D region 202, thus avoiding contact shorts and improving device reliability.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
   a top source/drain contact within a second interlevel dielectric layer, the top source/drain contact surrounding a top portion of a top source/drain region located above a channel fin, the channel fin extending vertically from a bottom source/drain region located above a substrate, the top source/drain contact including a first positive tapering profile, the first positive tapering profile being at a first tapering angle widening in a direction towards the top portion of the top source/drain region;
   a protective liner located between a bottom portion of the top source/drain region and portions of the second interlevel dielectric layer adjacent to the top source/drain region; and
   a bottom source/drain contact within the second interlevel dielectric layer, the bottom source/drain contact including a first negative tapering profile, the first negative tapering profile being at a second tapering angle narrowing in a direction towards the bottom source/drain region.

2. The semiconductor structure of claim 1, further comprising:
   a top spacer located along an upper portion of the channel fin, the top spacer located above a high-k metal gate stack disposed along a middle portion of the channel fin for separating the top source/drain region from the high-k metal gate stack;
   a first interlevel dielectric layer disposed along sidewalls of the top spacer and the high-k metal gate stack, a top surface of the first interlevel dielectric layer being coplanar with a top surface of the top spacer, the protective liner located above and in direct contact with coplanar top surfaces of the first interlevel dielectric layer and the top spacer; and
   a bottom spacer located along a bottom portion of the channel fin, the high-k metal gate stack and the first interlevel dielectric layer being located above the bottom spacer, the bottom source/drain region located below the channel fin and the bottom spacer.

3. The semiconductor structure of claim 2, further comprising:
   a gate contact within the second interlevel dielectric layer, the gate contact including a second negative tapering profile, the second negative tapering profile being at a third tapering angle narrowing in a direction towards the high-k metal gate stack.

4. The semiconductor structure of claim 1, wherein the protective liner comprises at least one of titanium nitride, titanium, and titanium oxide.

5. The semiconductor structure of claim 2, wherein the protective liner is located at an interface between the bottom portion of the top source/drain region, top surfaces of the top spacer adjacent to the top source/drain region, and portions of the second interlevel dielectric layer located between two consecutive top source/drain regions, wherein the protective liner is disposed on opposing bottom sides of the top source/drain region to avoid over etching the first interlevel dielectric layer located between adjacent top source/drain regions.

6. The semiconductor structure of claim 1, wherein the positive tapering profile includes a top critical dimension of the top source/drain contact being smaller than a bottom critical dimension of the top source/drain contact.

7. The semiconductor structure of claim 3, wherein the first negative tapering profile of the bottom source drain contact includes a top critical dimension of the bottom source/drain contact being larger than a bottom critical dimension of the bottom source/drain contact, and wherein the second negative tapering profile of the gate contact includes a top critical dimension of the gate contact being larger than a bottom critical dimension of the gate contact.

* * * * *